US010304982B2

(12) United States Patent
Salomé et al.

(10) Patent No.: US 10,304,982 B2
(45) Date of Patent: May 28, 2019

(54) SOLAR CELL MODULE

(71) Applicant: INL-International Iberian Nanotechnology Laboratory, Braga (PT)

(72) Inventors: Pedro Salomé, Braga (PT); Sascha Sadewasser, Braga (PT)

(73) Assignee: INL-INTERNATIONAL IBERIAN NANOTECHNOLOGY LABORATORY, Braga (PT)

( * ) Notice: Subject to any disclaimer, the term of this patent is extended or adjusted under 35 U.S.C. 154(b) by 0 days.

(21) Appl. No.: 15/736,606

(22) PCT Filed: Jun. 10, 2016

(86) PCT No.: PCT/EP2016/063237
§ 371 (c)(1),
(2) Date: Dec. 14, 2017

(87) PCT Pub. No.: WO2016/206989
PCT Pub. Date: Dec. 29, 2016

(65) Prior Publication Data
US 2018/0145197 A1    May 24, 2018

(30) Foreign Application Priority Data
Jun. 26, 2015    (EP) .................................... 15174105

(51) Int. Cl.
*H01L 31/0465*    (2014.01)
*H01L 31/0224*    (2006.01)
(Continued)

(52) U.S. Cl.
CPC .... *H01L 31/0465* (2014.12); *H01L 31/02327* (2013.01); *H01L 31/022483* (2013.01);
(Continued)

(58) Field of Classification Search
CPC ........................ H01L 31/0463; H01L 31/0465
See application file for complete search history.

(56) References Cited

U.S. PATENT DOCUMENTS 4,726,849 A * 2/1988 Murata ............. H01L 31/03921
136/244
8,716,591 B2 * 5/2014 Misra .................. H01L 31/1876
136/249
(Continued)

FOREIGN PATENT DOCUMENTS

DE    10 2004 055333 A1    5/2006
WO    WO 2013/042881 A2    3/2013

OTHER PUBLICATIONS

Extended European Search Report for European Application No. 15174105.5, dated Dec. 9, 2015.
(Continued)

*Primary Examiner* — Eli S Mekhlin
(74) *Attorney, Agent, or Firm* — Xsensus LLP

(57) ABSTRACT

The present invention relates to a solar cell module. The solar cell module (10, 100) comprising a first (102) and a second (104) solar cell, each comprising: a charge separating element (108) arranged to convert light to an electric voltage, a rear electrical contact (106a, 106b), and a transparent conductor (112), wherein the rear electrical contact (106a, 106b) is arranged in electrical contact with a first portion (103) of the charge separating element (108) and the transparent conductor (112) is arranged in electrical contact with a second portion (105) of the charge separating element (108), wherein the solar cells (102, 104) are interconnected at an interconnection region (114), wherein the rear electrical contact (106a) of the first solar cell (102) is physically separated from the rear electrical contact (106b) of the second solar cell (104), wherein an interconnection contact (118) is arranged to form an electrical connection between
(Continued)

the transparent conductor (112*a*) of the first solar cell (102) to the rear electrical contact (106*b*) of the second solar cell (104), wherein the rear electrical contact (106) and the interconnection contact (118) are metals, and a metal-metal contact is formed by the interconnection contact (118) and the rear electrical contact (106), the solar cell module further comprising a lens structure (122) arranged to concentrate light to the charge separating elements (108) of the first (102) and second (104) solar cells, wherein the lens structure (122) is further arranged such that light is not concentrated at the interconnection region (114).

13 Claims, 3 Drawing Sheets

(51) Int. Cl.
*H01L 31/0232* (2014.01)
*H01L 31/05* (2014.01)

(52) U.S. Cl.
CPC .. *H01L 31/022491* (2013.01); *H01L 31/0512* (2013.01); *Y02E 10/50* (2013.01)

(56) References Cited

U.S. PATENT DOCUMENTS

| | | |
|---|---|---|
| 2008/0271781 A1* | 11/2008 | Kushiya .............. H01L 31/0322 136/256 |
| 2009/0165851 A1 | 7/2009 | Sekimoto et al. |
| 2010/0300517 A1 | 12/2010 | Shinohara |
| 2011/0275193 A1* | 11/2011 | Brunton .................. H01L 31/18 438/463 |
| 2011/0308606 A1 | 12/2011 | Hsieh |
| 2012/0180844 A1 | 7/2012 | Ward, III |
| 2014/0261674 A1* | 9/2014 | Youngbull .......... H01L 31/0465 136/256 |
| 2015/0068580 A1 | 3/2015 | Probst |

OTHER PUBLICATIONS

International Search Report and Written Opinion for International Application No. PCT/EP2016/063237, dated Jul. 18, 2016.

\* cited by examiner

SOLAR CELL MODULE

RELATED APPLICATIONS

This application is a national stage application under U.S.C. § 371 of PCT International Application No. PCT/EP2016/063237, filed Jun. 10, 2016, which claims foreign priority benefits under 35 U.S.C. § 119(a)-(d) or 35 U.S.C. § 365(b) of European application number 15174105.5, filed Jun. 26, 2015, the contents of each of which are incorporated herein by reference in their entireties.

TECHNICAL FIELD

The present invention relates to a solar cell module.

BACKGROUND ART

Solar cells convert solar energy into electrical energy. A conventional solar cell module comprises a charge separating element arranged to absorb photons and to convert the energy of the photons into free charge carriers which are typically separated such that a potential difference is achieved over the charge separating element. The charge separating element typically comprises a pn-junction or forms part of a pn-junction. Hence, radiation of an appropriate wavelength falling on to the charge separating element may provide electron-hole pairs. A potential difference over the pn-junction is further obtained as holes and electrons move across the junction in opposite directions. An electric current may thereby be generated which may e.g. deliver electrical power to an external circuit.

A solar cell module may comprise a plurality of solar cells arranged in series to increase the voltage output generated. Efficient interconnection of the solar cells is, however, challenging. Problems associated with inefficient charge transport between the solar cells may reduce the voltage output and lower the overall conversion efficiency of the solar cell module.

SUMMARY OF THE INVENTION

It is an object of the present invention to provide an improvement of prior art. According to an aspect of the invention a solar cell module is provided. The solar cell module comprising a first and a second solar cell, each comprising: a charge separating element arranged to convert light to an electric voltage, a rear electrical contact, and a transparent conductor, wherein the rear electrical contact is arranged in electrical contact with a first portion of the charge separating element and the transparent conductor is arranged in electrical contact with a second portion of the charge separating element, wherein the solar cells are interconnected at an interconnection region, wherein the rear electrical contact of the first solar cell is physically separated from the rear electrical contact of the second solar cell, wherein an interconnection contact is arranged to form an electrical connection between the transparent conductor of the first solar cell to the rear electrical contact of the second solar cell, wherein the rear electrical contact and the interconnection contact are metals, and a metal-metal contact is formed by the interconnection contact and the rear electrical contact, the solar cell module further comprising a lens structure arranged to concentrate light to the charge separating elements of the first and second solar cells, wherein the lens structure is further arranged such that light is not concentrated at the interconnection region.

An advantage of the design of the solar cell module is that energy may efficiently be converted to electrical energy. Leakage currents which may reduce the voltage output from the charge separating element of the solar cell are further mitigated.

An increased parallel resistance between the two solar cells is achieved by the rear electrical contact of the first solar cell being physically separated from the rear electrical contact of the second solar cell. Hence, the physical separation reduces charge transport from the rear electrical contact of one solar cell to the rear electrical contact of the other solar cell.

The electrical connection formed by the interconnection contact reduces the electrical resistance. Charges may thereby be efficiently transferred from the transparent conductor of the first solar cell to the rear electrical contact of the second solar cell. Junctions providing reduced electrical contact resistance are further provided between the interconnection contact and the transparent conductor of the first solar cell and between the interconnection contact and the rear electrical contact of the second solar cell. A reduced serial resistance of the two solar cells of the solar cell module may thereby be obtained. An increased voltage output from the solar cell may thus be achieved.

A reduced electrical contact resistance may further be provided by the interconnection contact and the rear electrical contact forming a metal metal contact. An improved charge transport between the first and the second solar cells may thereby be achieved.

A more efficient conversion of light energy to electrical energy may further be achieved by the lens structure. Less material may, moreover, be needed for forming the charge separating element. Hence, a more cost effective solar cell module may be provided. To this end, more light may reach the charge separating elements and a solar cell having higher conversion efficiency may be achieved, by arranging the lens structure such that light is not concentrated at the interconnection region. By reducing the amount of light reaching the interconnection region a lower parasitic conductivity in the interconnection region may further be achieved.

The wording charge separating element should be understood as an element arranged to absorb photons and to convert at least a portion of energy of the photons into charge carriers. Optical energy is thereby converted into electrical energy. Hence, the charge separating element may be arranged to absorb photons and to create a gradient of carriers such that at least a portion of energy of the photons are converted into charge carriers. The charge separating element provides a potential difference, i.e. a voltage, between the first and the second portion of the charge separating element. The rear electrical contact, the transparent conductor and the interconnection contact are further arranged to extract the voltage generated by the charge separating element.

The first portion of the charge separating element and the second portion of the charge separating element may be opposite to each other.

The rear electrical contact of the first solar cell may be electrically insulated from the rear electrical contact of the second solar cell by a first electrical insulator. An increased parallel resistance between the two solar cells may thus be achieved.

The transparent conductor of the first solar cell may be physically separated from the transparent conductor of the second solar cell by a void. The amount of electrical charges transported between the transparent conductor of the first solar cell and the transparent conductor of the second solar cell may thereby be reduced. An increased parallel resistance between the two solar cells may be achieved. Hence, the voltage output from the solar cell module may be improved.

The rear electrical contact may be formed by a first metal and the interconnection contact may be formed by a second metal.

An efficient electrical connection with reduced electrical resistance may thereby be formed between the interconnection contact and the rear electrical contact. Charges generated by the solar cell module may thereby be efficiently transferred from the transparent conductor of the first solar cell to the rear electrical contact of the second solar cell by the interconnection contact.

The first metal and the second metal may be the same metal or different metals. A greater flexibility in choosing metals for forming the metal metal contact is thereby achieved.

The interconnection region may further comprise a second electrical insulator arranged to electrically insulate the charge separating element of the first solar cell from the interconnection contact. Parasitic charge transfer from the charge separating element and/or the interconnection contact may thereby be reduced.

The first electrical insulator and the second electrical insulator may be integrally formed. Problems associated with an interface formed between the first and the second electrical insulators may thereby be reduced. Hence, undesired transfer of charges to or from the charge separating element may be reduced. An increase in the potential difference over the charge separating element may result. A more efficient electrical insulation of the charge separating element of the first solar cell from the interconnection contact may be achieved. A more efficient electrical insulation between the rear electrical contact of the first solar cell and the rear electrical contact of the second solar cell may further be achieved.

The charge separating element may comprise a buffer element. The buffer element and charge separating element may form parts of a pn-junction arranged to convert light to an electric voltage. Efficient separation of charge carriers generated by the light absorbed by the solar cell may thereby be achieved. The buffer element may be in the form of a layer and may in some embodiments be referred to as a buffer layer.

At least one of the first and second solar cells may comprise a plurality of charge separating elements separated from each other by an additional electrical insulator arranged to electrically insulate portions of neighbouring charge separating elements within the solar cell. An increased generation of charge carriers may thereby be achieved within the solar cell. The additional electrical insulator may reduce parasitic charge transfer between the charge separating elements. A reduction in voltage output caused by the leakage currents from the individual charge separating elements may thus be mitigated.

The interconnection contact may comprise a metal, preferably
Cu, Al, Ag, Mo, W, Cr, Ta, Nb, V, Ti, Mn, ZrN, TiN, Nb:TiO$_2$, TiB$_2$ or combinations thereof, allowing for efficient transport of charges from the transparent conductor of the first solar cell to the rear electrical contact of the second solar cell.

The charge separating element may be a compound semiconductor material consisting of Cu(In, Ga)Se$_2$, Cu(In, Ga)(S, Se)$_2$, Cu$_2$ZnSn(S, Se)$_4$, or CdTe.

The transparent conductor may comprise ZnO, In$_2$O$_3$:SnO$_2$, SnO$_2$:F, CdO:In, carbon nanotubes or graphene.

The first, second and/or additional electrical insulators may comprise an electrical insulator, preferably Al$_2$O$_3$, SiO$_2$, Al$_2$O$_x$, Al$_2$O$_x$, SiO$_x$, HfO$_x$, Si$_3$N$_x$, Al$_3$N$_x$.

The rear electrical contact may comprise Cu, Al, Ag, Mo, W, Cr, Ta, Nb, V, Ti, Mn, ZrN, TiN, Nb:TiO$_2$, TiB$_2$ or combinations thereof.

The electrical contact may be formed by a first metal and the interconnection contact may be formed by a second metal.

The first metal may, for example, be selected from the group of Cu, Al, Ag, Mo, W, Cr, Ta, Nb, V, Ti, Mn, ZrN, TiN, Nb:TiO$_2$, TiB$_2$ or combinations thereof.

The second metal may, for example, be selected from the group of Cu, Al, Ag, Mo, W, Cr, Ta, Nb, V, Ti, Mn, ZrN, TiN, Nb:TiO$_2$, TiB$_2$ or combinations thereof, The first metal and the second metal may be the same metal or different metals.

The solar cell module may further comprise a substrate with a diffusion barrier, wherein the rear electrical contact is arranged on the diffusion barrier.

Further features of, and advantages with, the present invention will become apparent when studying the appended claims and the following description. The skilled person will realize that different features of the present invention may be combined to create embodiments other than those described in the following, without departing from the scope of the present invention.

BRIEF DESCRIPTION OF THE DRAWINGS

This and other aspects of the present invention will now be described in more detail, with reference to the enclosed drawings showing embodiments of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein. These embodiments are rather provided for thoroughness and completeness, and for fully conveying the scope of the invention to the skilled person.

Figure 1:
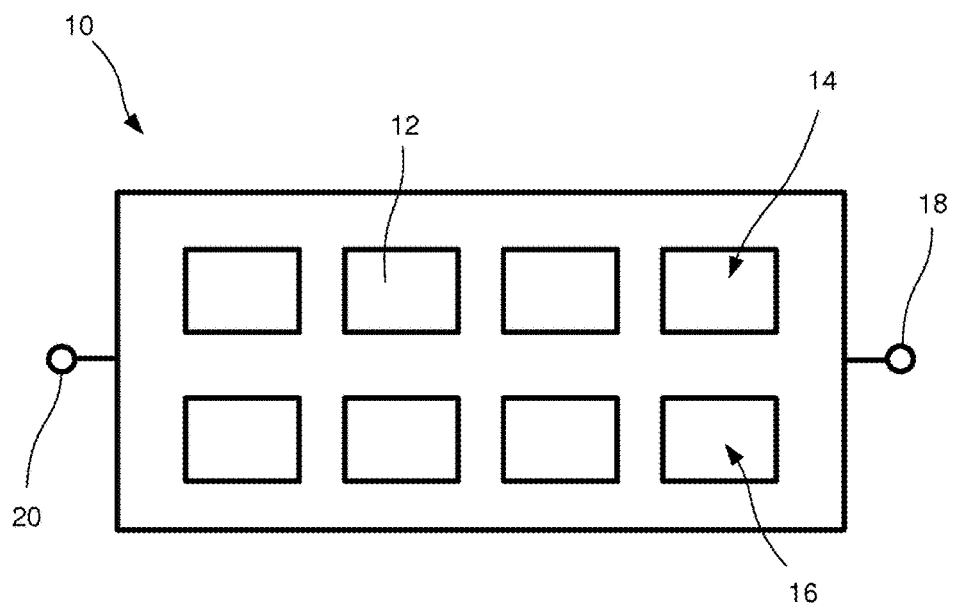
FIG. 1 illustrates a schematic top view of a solar cell module.

FIG. 1 illustrates a schematic top view of a solar cell module 10. The solar cell module 10 comprises a plurality of solar cells 12 arranged along two rows 14, 16. The solar cells 12 convert optical energy into electrical energy. The solar cells 12 within each row 14, 16 may be interconnected and arranged in series (not shown) to increase the potential difference between the output contacts 18, 20, i.e. provide the sum of the voltage outputs generated by the individual solar cells 12. In other words, a connection may be provided between a terminal, having a polarity, of a first solar cell 12 to a terminal, having an opposite polarity, of a second solar cell 12. The series circuit formed by the solar cells thereby form one path for current extraction which may create the desired additive voltage.

The rows 14, 16 may further be connected in parallel (not shown) to increase the current generated by the solar cell module 10. The person skilled in the art realizes that other arrangements of the solar cells 12 of the solar cell module 10 may be used.

The conversion of optical energy, such as solar energy, into electrical energy of the solar cell 12 is achieved by a charge separating element (not shown) formed in the solar cell 12. The charge separating element is arranged to absorb photons and to convert the energy of the photons into charge carriers which are separated. A potential difference may thereby be achieved over the charge separating element.

In the following a solar cell module 100 comprising a first 102 and a second 104 solar cell is described with reference to FIG. 2. A solar cell 12 of FIG. 1 may be of the same type as one of the solar cells 102 or 104 of FIG. 2.

Figure 2:
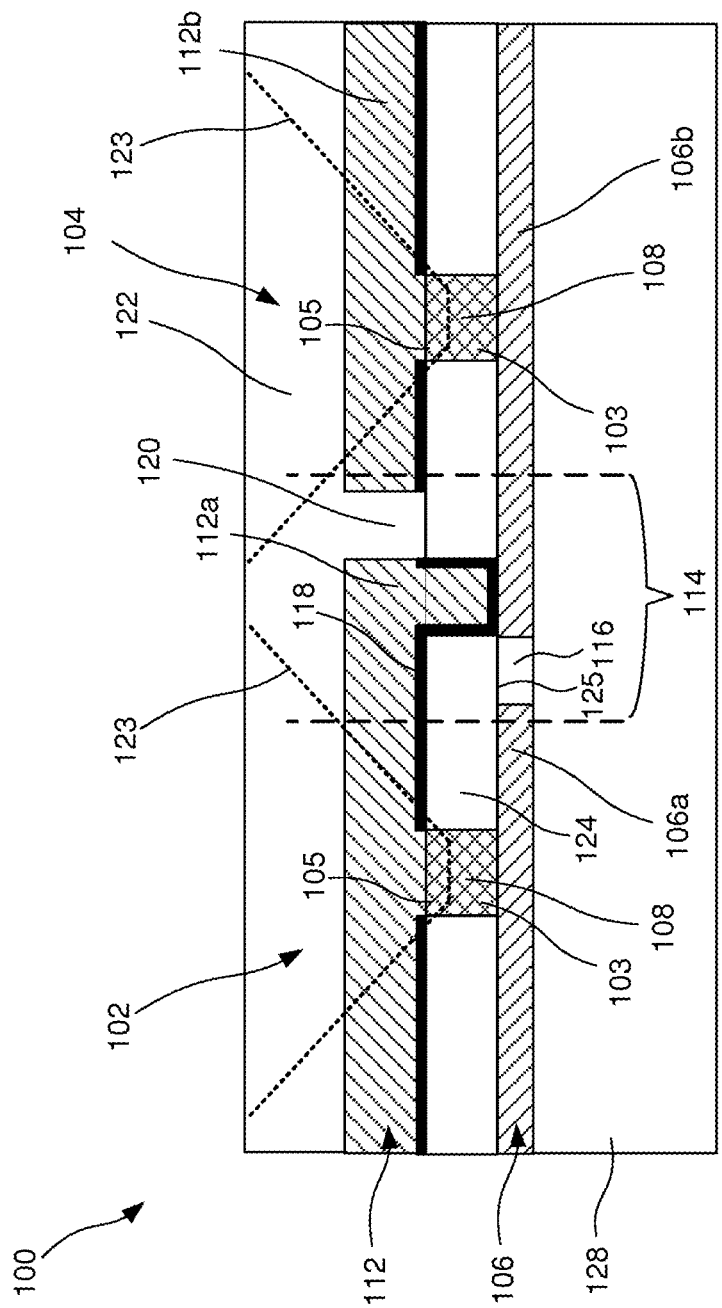
FIG. 2 illustrates a schematic cross-sectional side view of a solar cell module.

As illustrated in FIG. 2, each solar cell 102, 104 comprises a charge separating element 108, a rear electrical contact 106, and a transparent conductor 112. The solar cell module 100 further comprises a substrate 128 on top of which the rear electrical contact 106 may be arranged.

The charge separating element 108 is arranged to convert light reaching the solar cell module 100 to an electric voltage. Hence, light absorbed by the charge separating element 108 is at least partly converted into electrical energy. In the energy conversion charge carriers may be formed which are physically separated by, for instance, an internal electric field within the charge separating element 108. The charge separating element may thereby provide a potential difference, i.e. a voltage, between a first 103 and a second 105 portion of the charge separating element 108. Hence, the first 103 and the second 105 portions of the charge separating element 108 may comprise distributions of charge carriers such that the respective portions 103, 105 are of different polarity giving rise to the potential difference. The rear electrical contacts 106a, 106b, and the transparent conductors 112a, 112b of the solar cells 102, 104 are arranged in electrical contact with the respective portions 103, 105 of the charge separating element 108 in order to extract the voltage generated.

In FIG. 2, the first portion 103 of the charge separating element 108 and the second portion 105 of the charge separating element 108 are arranged opposite to each other. The skilled person, however, realizes that other arrangements are possible. The charge separating element 108 may for example comprise a core-shell structure or a multilayer structure.

The charge separating element 108 may comprise a pn-junction. The rear electrical contact 106 may for example be in contact with the p-type material of the pn-junction and the transparent conductor 108 may be in contact with the n-type material of the pn-junction or vice versa.

The solar cells 102, 104 are further interconnected at an interconnection region 114. The interconnection region 114 is arranged to connect the two solar cells 102 and 104 in series. More specifically, an interconnection contact 118 is arranged to form an electrical connection between the transparent conductor 112a of the first solar cell 102 to the rear electrical contact 106b of the second solar cell 104. Efficient charge transport, i.e. reduced resistance, between the two solar cells 102 and 104 may thereby be achieved.

The rear electrical contact 106 may comprise or be formed by a metal such as Mo.

The interconnection contact 118 may further comprise a metal, preferably Cu, Al, Ag, Mo, W, Cr, Ta, Nb, V, Ti, Mn, ZrN, TiN, Nb:$TiO_2$, $TiB_2$ or combinations thereof. A reduced serial resistance between the transparent conductor 112a of the first solar cell 102 to the rear electrical contact 106b of the second solar cell 104 may thereby be achieved.

Hence, the rear electrical contact 106 and the interconnection contact 118 may both comprise a metal. The metal may be the same for the two contacts 106 and 118.

By providing a metal-metal contact comprising the interconnection contact 118 and the rear electrical contact 106 a reduced electrical contact resistance may further be provided between the two solar cells 102 and 104. An improved charge transport between the two solar cells 102 and 104 may thereby be achieved. Problems such as interface states and band bending effects which may be present for a contact formed by a semiconductor and the metal rear electrical contact may further be mitigated by the metal-metal contact.

In the interconnection region 114, the rear electrical contact 106a of the first solar cell 102 is physically separated from the rear electrical contact 106b of the second solar cell 104. The amount of charges which may leak between the rear electrical contacts 106a and 106b may thereby be reduced.

The rear electrical contact 106a of the first solar cell 102 may be electrically insulated from the rear electrical contact 106b of the second solar cell 104 by a first electrical insulator 116, as illustrated in FIG. 2. Hence, the first electrical insulator 116 acts as the physical separator between the two rear electrical contacts 106a, 106b. An increased parallel resistance between the two solar cells is achieved.

The interconnection region 114 may further comprise a second electrical insulator 124 arranged to electrically insulate the charge separating element 108 of the first solar cell 102 from the interconnection contact 118. Leakage currents may thus be reduced.

The first electrical insulator 116 and the second electrical insulator 124 may be integrally formed (not shown). Problems associated with an interface 125 formed between the first 116 and the second 124 electrical insulators may thereby be reduced. A more efficient electrical insulation between the rear electrical contacts 106a and 106b may further be achieved.

Transfer of charges between the transparent conductor 112a of the first solar cell 102 and the transparent conductor 112b of the second solar cell 104 may at least be reduced by providing a void 120 in the solar cell module 100. The void 120 physically separates the transparent conductors 112a and 112b of the two solar cells 102 and 104, respectively. A higher electrical resistance, i.e. a parallel resistance, between the transparent conductor 112a of the first solar cell 102 and the transparent conductor 112b of the second solar cell 104 is thereby provided. Hence, the voltage output from the solar cell module 100 may be improved.

The void 120 may comprise a gas such as air or may be filled with an electrically insulating material, preferably $Al_2O_3$, $SiO_2$, $Al_2O_x$, $SiO_x$, $HfO_x$, $Si_3N_x$, $Al_3N$.

The solar cell module 100 may further comprise a lens structure 122 arranged to concentrate light to the charge separating elements 108 of the first 102 and second 104 solar cells. A higher light intensity may thereby be achieved at the charge separating elements 108. An increased conversion of optical energy to electrical energy may thereby be achieved.

The amount of material needed for forming the charge separating element 108 is further reduced. A more cost effective solar cell module 100 may be provided.

The redistribution of light reaching the solar cell module 100 achieved by the lens structure 122 is illustrated schematically in FIG. 2 by truncated triangles 123, see the dashed lines 123. The skilled person realizes that the actual distribution of light may for instance depend on the shape and/or the material of the lens structure 120, as well as the angle of incidence of the light on the solar cell module 100.

The lens structure 122 may further be arranged such that light is not concentrated at the interconnection region 114. By reducing the amount of light reaching the interconnection region 114 the amount of light reaching the charge separating element 108 of the solar cells 102 may be increased. A larger conversion of optical to electrical energy may thereby be obtained. A lower parasitic conductivity in the interconnection region 114 may further be achieved.

The lens structure 122 may comprise a Fresnel lens.

A solar cell may further comprise a plurality of charge separating elements. An increased generation of free charge carriers may thereby be achieved within the solar cell.

Figure 3:
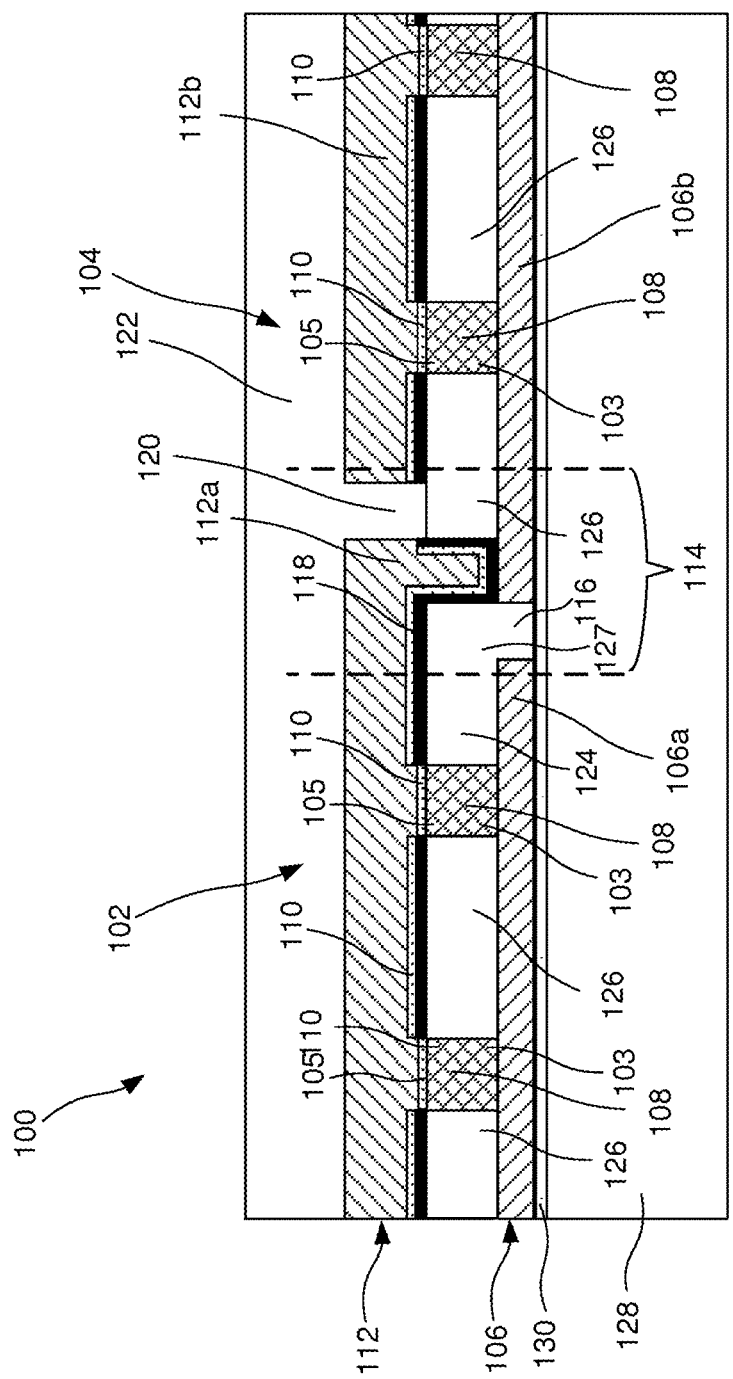
FIG. 3 illustrates a schematic cross-sectional side view of another solar cell module.

To this end, FIG. 3 illustrates a schematic cross-sectional side view of a solar cell module 100 where a plurality of charge separating elements 108 is shown. The charge separating elements 108 may be physically separated from each other by an additional electrical insulator 126. The additional electrical insulator 126 is arranged to electrically insulate portions of neighbouring charge separating elements within the solar cells 102 and 104. An increased generation of charge carriers may thereby be achieved within each of the solar cells 102, 104. The additional electrical insulator 126 may further reduce parasitic charge transfer between the charge separating elements 108. Hence, an increased voltage output from the individual charge separating elements 108 may be obtained. The skilled person in the art realizes that the number of charge separating elements 108 may differ from the two illustrated in FIG. 3. The number of charge separating elements 108 may moreover be different in different solar cells of a solar cell module.

The additional electrically insulator 126 may be a layer.

The first electrically insulator 116 and the second electrically insulator 124 may be formed integrally 127. The integral structure 127 may be formed as an integral layer.

The second electrically insulator 124 and the additional electrically insulator 126 may in some embodiment be formed integrally.

The charge separating element 108 may comprise a buffer element 110. The buffer layer 110 and charge separating element 108 may form parts of a pn-junction arranged to convert light to an electric voltage as will be discussed further below. Efficient separation of charge carriers generated by the light absorbed by the solar cell may thereby be achieved.

The material of the buffer element 110 may be arranged in the form of a layer. Hence, the buffer element 110 may in some embodiments be referred to as a buffer layer. It should be noted that the material of the buffer element 110 may further be present at other locations than at the charge separating element 108 of the solar cells 102, 104. The locations at which the material of the buffer element 110 is present in the solar cell module 100 may depend on the fabrication methods used for providing the solar cell module 100. The material of the buffer element 110 may for example be present on the interconnection contact 118, when using material deposition techniques such as chemical bath deposition, CBD, sputtering, or atomic layer deposition, ALD, as illustrated in FIG. 3.

It shall be noted that the embodiments disclosed in connection with FIG. 2 and even further embodiments may also comprise the buffer element 110 as disclosed above.

In the following various materials suitable for use in the solar cell modules 10, 100 described above is provided.

The charge separating element 108 may, for example, comprise a compound such as $Cu(In,Ga)Se_2$, or $Cu(In, Ga)(S, Se)_2$, also referred to as CIGS compounds, $Cu_2ZnSn(S, Se)_4$, or CdTe. These compounds have higher absorption coefficients as compared to silicon which may increase the conversion efficiency of the solar cell modules. To this end, a lower thickness of the charge separating element may be needed to collect the same amount of photons as compared to silicon based solar cells. Thinner and thereby more cost effective solar cell modules 100 may therefore be provided.

The charge separating element 108 may comprise a CIGS compound which is of p-type. The buffer element 110 of the charge separating element 108 may further comprise a CdS material which is of n-type. The charge separating element 108 and the buffer element 110 may thereby form parts of a pn-junction arranged to convert light reaching the solar cell module 100 to an electric voltage.

As illustrated in FIG. 3, the transparent conductor 112 may further be arranged on top of the buffer element 110. The transparent conductor 112 may comprise a i-ZnO/ZnO:Al material, i.e. a thin, intrinsic zinc oxide layer (i-ZnO) which is capped by a thicker, aluminium, Al, doped ZnO layer. The i-ZnO layer may be used to protect the CdS buffer element 110 and other portions of the charge separating element 108 from sputtering damage while fabricating, e.g. depositing, the ZnO:Al layer. The Al-doped ZnO of the transparent conductor 112 serves as a transparent conducting oxide, TCO, arranged to collect and transport charges from the charge separating element 108 of the solar cell 100 while absorbing as little light as possible.

The p-type GIGS compound of the charge separating element 108 may be doped p-type by intrinsic defects, while the ZnO the transparent conductor 112 may be doped n-type to a much larger extent through the incorporation of Al. This asymmetric doping provides a space-charge region extending to a larger extent into the GIGS than into the ZnO. The absorption of light is thereby designed to occur in the charge separating element 108. To this end, the skilled person realizes that the thicknesses and band gaps of charge separating element 108, the buffer element 110, and the transparent conductor 112 are chosen such that the light is absorbed predominately in the charge separating element 108.

As discussed above the transparent conductor 112 may further serve as a front contact for current collection.

To this end, the interconnection contact 118 may provide a metal semiconductor interface between the metal interconnection contact 118 and the semiconductor transparent conductor 112. An improved electrical transport of charges to or from the transparent conductor 112 may thereby be obtained. The efficiency of the solar cell module 100 to convert optical to electrical energy may thereby be improved.

The rear electrical contact 106 may further serve as a back contact for current collection. The rear electrical contact 106 may comprise Cu, Al, Ag, Mo, W, Cr, Ta, Nb, V, Ti, Mn, ZrN, TiN, $Nb:TiO_2$, $TiB_2$ or combinations thereof. Efficient contacting of the solar cell module 100 may thus be provided.

The substrate may further provide improved handling to the solar cell module 100.

The substrate 128 may for example comprise soda-lime glass, but the skilled person realizes that other substrates may be used as will be described below.

The solar cell module 100 may comprise a diffusion barrier 130 arranged on the substrate 128. The rear electrical contact 106 may be arranged on the diffusion barrier 130. The diffusion barrier 130 may comprise sodium which has been shown to yield a substantial open-circuit voltage increase through surface and/or grain boundary defect passivation.

A sodium layer may alternatively be arranged on the diffusion barrier.

The diffusion barrier 130 may comprise $SiO_2$.

The first, second and/or additional electrical insulators 116, 124, 126 may comprise an electrical insulator, preferably $Al_2O_3$ or $SiO_2$. Alternatively electrical insulators 116, 124, 126 may be selected from a group consisting of dielectric materials such as $Al_2O_x$, $SiO_x$, $HfO_x$, $Si_3N_x$, $Al_3N_x$.

The lens structure 122 may comprise a translucent or transparent material for at least a portion of the solar spectrum.

The lens structure 122 may comprise a glass material, a high refraction index material, or a plastic such as Polyvinyl chloride, PVC or a polymer such as Poly(methyl methacrylate), PMMA.

The lens structure 122 may alternatively comprise a wide band gap semiconductor material.

The lens structure may further comprise anti-reflective coating to increase the amount of light incident on the solar cell which reaches the charge separating element.

The solar cell modules 10, 100 described above may be formed by standard fabrication techniques known to the skilled person in the art. Simple, cost effective and reliable methods for providing solar cells may thereby be used.

The rear electrical contact 106 and the interconnection contact 116 may for example be formed by thermal evaporation, sputtering or electroplating.

The physical separation between the rear electrical contact 106a and 106b and/or the void 120 may be provided by chemical etching, focused ion beam machining, laser drilling, or physical removal, e.g. by diamond scribing, of a portion of the materials of the solar cell module 100, see for example FIG. 1 or 2.

The electrical insulators 116, 124 and 126 may be formed by atomic layer deposition, ALD, chemical vapour deposition, CVD, or chemical bath deposition, CBD, processes.

Openings in layers forming the electrical insulators 116, 124 and 126 may for example be provided by photolithography or nano-imprint lithography, NIL, techniques, or laser ablation.

The formation of the charge separating elements 108 may for example be formed by epitaxial growth techniques such as chemical beam epitaxy, CBE, or metal organic vapour phase epitaxy, MOVPE, know to the skilled person in the art.

The charge separating elements may be provided by thermal evaporation of elements such as Cu, Se, and In and/or Ga by, for instance, molecular beam epitaxy, MBE, techniques or MOVPE.

Selenization techniques using a deposited precursor layer, of for example Cu/In/Ga, followed by chemical reactions in a Se atmosphere may alternatively be used to provide the charge separating elements.

The charge separating elements may be formed at locations not comprising the electrical insulators 116, 124 and 126 using conventional processing techniques.

The transparent conductor 112 may be formed using shunt reducing of intrinsic ZnO layer, i-ZnO, and subsequently sputtering of Al-doped ZnO, ZnO:Al.

The person skilled in the art further realizes that the present invention by no means is limited to the preferred embodiments described above. On the contrary, many modifications and variations are possible within the scope of the appended claims.

For example, the substrate 128 may be a glass material such as alkali-aluminosilicate glass or boro-silicate glass. The substrate 128 may alternatively comprise a metal foil, a ceramic substrate, or a plastic substrate.

The charge separating element 108 may alternatively be a semiconductor material comprising a plurality of elements from the periodic table. The charge separating element 108 may be of a group IV element such as Si, amorphous Si, nanocrystalline silicon or micromorphous silicon.

The charge separating element 108 may comprise a III-V or a II-VI semiconductor material. Hence, the charge separating element may in some embodiments for example comprise GaAs, and InP. The charge separating element 108 may be of a material having a perovskite crystal structure.

The charge separating element may comprise an organic semiconductor.

The substrate 128 may form the rear electrical contact 106.

The charge separating element 108 may be formed by a chalcopyrite or a kesterite material. For such materials the substrate 128 may be a sheet of glass or foil.

The buffer element 110 may comprise a material selected from a group consisting of CdS, $Zn_{1-x}Sn_xO_y$, $In_2S_3$, Zn(S,O,OH), Zn(S,O), $InS_xO_y$, ZnS, $ZnS:In_2S_3$, $In_xS_y$.

The transparent conductor 112 may, moreover, comprise a material selected from a group consisting of Ga-doped ZnO, $SnO_2:In_2O_3$, $SnO_2:F$, CdO:In, graphene, and carbon nano-tubes.

The charge separating element 108 have in the above description been disclosed to comprise the buffer element. The skilled person, however, realizes that in other embodiments the transparent conductor may comprise the buffer element. The transparent conductor and the buffer element may for example be formed in a single layer.

The lens structure 122 may comprise micro-lenses.

The void 120 may comprise a material of the lens structure 122, such as a polymer or glass material whereby the transparent conductor 112a of the first solar cell 102 may be electrically insulated from the transparent conductor 112b of the second solar cell 104. Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A solar cell module, comprising:
    a first solar cell and a second solar cell, each comprising:
        a rear electrical contact;
        a transparent conductor; and
        a charge separating element between the rear electrical contact and the transparent conductor along a first axis, the charge separating element configured to convert light to an electric voltage; and a lens structure configured to concentrate light through the transparent conductors and to the charge separating elements of the first solar cell and the second solar cell, wherein the rear electrical contact is in electrical contact with a first portion of the charge separating element, the transparent conductor is in electrical contact with a second portion of the charge separating element, the first solar cell and the second solar cell are interconnected at an interconnection region, an electrical insulator is between the interconnection region and the charge separating element of the first solar cell along a second axis that is perpendicular to the first axis, the rear electrical contact of the first solar cell is physically separated from the rear electrical contact of the second solar cell along the second axis, an interconnection contact is between the transparent conductor of the first solar cell and the electrical insulator along the first axis at a first position, the interconnection contact is between the rear electrical contact of the second solar cell and the transparent conductor of the first solar cell along the first axis at a second position, the interconnection contact forming an electrical connection between the transparent conductor of the first solar cell and the rear electrical contact of the second solar cell at the second position, the electrical insulator electrically insulates the charge separating element of the first solar cell from the interconnection contact along the second axis, the rear electrical contacts and the interconnection contact are metals, and a metal-to-metal contact is formed between the interconnection contact and the rear electrical contact of the second solar cell at the second position, and the lens structure is further arranged such that the light is not concentrated at the interconnection region.

2. The solar cell module according to claim 1, wherein the rear electrical contact of the first solar cell is electrically insulated from the rear electrical contact of the second solar cell by a first electrical insulator.

3. The solar cell module according to claim 2, wherein the electrical insulator and the first electrical insulator are integrally formed.

4. The solar cell module according to claim 1, wherein the transparent conductor of the first solar cell is physically separated from the transparent conductor of the second solar cell by a void.

5. The solar cell according to claim 1, wherein the rear electrical contact is formed by a first metal and the interconnection contact is formed by a second metal, wherein the first metal and the second metal are different metals.

6. The solar cell module according to claim 1, wherein the charge separating element comprises a buffer element.

7. The solar cell module according to claim 1, wherein at least one of the first solar cell and the second solar cell comprises:

a plurality of charge separating elements separated from each other by an additional electrical insulator arranged to electrically insulate portions of neighbouring charge separating elements from each other.

8. The solar cell module according to claim 1, wherein the interconnection contact comprises a metal selected from Cu, Al, Ag, Mo, W, Cr, Ta, Nb, V, Ti, Mn, ZrN, TiN, Nb:$TiO_2$, $TiB_2$ or a combination thereof.

9. The solar cell module according to claim 1, wherein the charge separating element is a compound semiconductor material consisting of Cu(In, Ga)$Se_2$, Cu(In, Ga)(S, Se)$_2$, $Cu_2$ZnSn(S, Se)$_4$, or CdTe.

10. The solar cell module according to claim 1, wherein the transparent conductor comprises ZnO, $In_2O_3$:$SnO_2$, $SnO_2$:F, CdO:In, carbon nanotubes or graphene.

11. The solar cell module according to claim 1, wherein the electrical insulator comprises a material selected from $Al_2O_3$, $SiO_2$, $Al_2O_x$, $SiO_x$, $HfO_x$, $Si_3N_x$, $Al_3N_x$.

12. The solar cell module according to claim 1, wherein the rear electrical contact comprises Cu, Al, Ag, Mo, W, Cr, Ta, Nb, V, Ti, Mn, ZrN, TiN, Nb:$TiO_2$, $TiB_2$ or combinations a combination thereof.

13. The solar cell module according to claim 1, further comprising:

a substrate with a diffusion barrier, wherein the rear electrical contact is arranged on the diffusion barrier.

* * * * *